United States Patent
Puigardeu Aramendia et al.

(10) Patent No.: US 11,568,096 B2
(45) Date of Patent: Jan. 31, 2023

(54) PROCESSING AN OBJECT REPRESENTATION

(71) Applicant: HEWLETT-PACKARD DEVELOPMENT COMPANY, L.P., Spring, TX (US)

(72) Inventors: Sergio Puigardeu Aramendia, Sant Cugat del Valles (ES); Manuel Freire Garcia, Sant Cugat del Valles (ES); Jordi Sanroma Garrit, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/605,322

(22) PCT Filed: Jan. 29, 2018

(86) PCT No.: PCT/US2018/015786
§ 371 (c)(1),
(2) Date: Oct. 15, 2019

(87) PCT Pub. No.: WO2019/160526
PCT Pub. Date: Aug. 22, 2019

(65) Prior Publication Data
US 2020/0356707 A1    Nov. 12, 2020

(51) Int. Cl.
*G06T 15/00*    (2011.01)
*G06F 30/12*    (2020.01)
*G06T 15/10*    (2011.01)
*G06T 19/20*    (2011.01)
*G06T 15/04*    (2011.01)
*B33Y 10/00*    (2015.01)
(Continued)

(52) U.S. Cl.
CPC .............. *G06F 30/12* (2020.01); *G06T 15/04* (2013.01); *G06T 15/10* (2013.01); *G06T 19/20* (2013.01); *B33Y 10/00* (2014.12); *B33Y 50/02* (2014.12); *B33Y 80/00* (2014.12); *G06T 2219/2021* (2013.01)

(58) Field of Classification Search
CPC ................................ G06F 30/12; G06T 19/20
See application file for complete search history.

(56) References Cited

U.S. PATENT DOCUMENTS 9,715,761 B2    7/2017    Lee et al.
2009/0174709 A1    7/2009    Kozlak et al.
(Continued)

FOREIGN PATENT DOCUMENTS

CN    105058799 A    11/2015
CN    105339551 A    2/2016
(Continued)

OTHER PUBLICATIONS

Tips for Designing 3d Printed Parts, 2016, https://innovationstation.utexas.edu/tip-design/.

*Primary Examiner* — Charles Tseng
(74) *Attorney, Agent, or Firm* — Michael Dryja

(57) ABSTRACT

A method of adjusting a three-dimensional representation of an object to be manufactured in an additive manufacturing process comprises determining a processing operation to be applied to the object, and adjusting the three-dimensional representation of the object based on adjustment parameters associated with the processing operation.

17 Claims, 3 Drawing Sheets

(51) Int. Cl.
   *B33Y 50/02*      (2015.01)
   *B33Y 80/00*      (2015.01)

(56) References Cited

U.S. PATENT DOCUMENTS

| | | | |
|---|---|---|---|
| 2015/0142153 A1* | 5/2015 | Chun | B29C 64/40 |
| | | | 700/98 |
| 2016/0243644 A1 | 8/2016 | Moneta et al. | |
| 2017/0116740 A1 | 4/2017 | Kimura | |
| 2017/0140512 A1 | 5/2017 | Hemani et al. | |
| 2017/0232515 A1 | 8/2017 | DeMuth et al. | |
| 2017/0310935 A1* | 10/2017 | Sinclair | B29C 64/245 |
| 2018/0093418 A1* | 4/2018 | Lappas | B33Y 30/00 |
| 2019/0168305 A1* | 6/2019 | Boyle | B22F 3/24 |

FOREIGN PATENT DOCUMENTS

| | | |
|---|---|---|
| CN | 107511683 A | 12/2017 |
| EP | 3205483 A1 | 8/2017 |
| WO | WO-2015077256 A1 | 5/2015 |
| WO | WO-2017098003 A2 | 6/2017 |
| WO | WO-2018140034 A1 | 8/2018 |

\* cited by examiner

PROCESSING AN OBJECT REPRESENTATION

BACKGROUND

Additive manufacturing techniques such as three-dimensional (3D) printing relate to techniques for making 3D objects of almost any shape from a digital 3D model through additive processes in which 3D objects are generated on a layer-by-layer basis under computer control. A large variety of additive manufacturing technologies have been developed differing in build materials, deposition techniques and processes by which the 3D object is formed from the build material. Such techniques may range from applying ultraviolet light to photopolymer resin, to melting semi-crystalline thermoplastic materials in powder form, to electron-beam melting of metal powders.

Additive manufacturing processes may begin with a digital representation of a 3D object or objects to be manufactured. This digital representation may be virtually sliced into layers by computer software or may be provided in pre-sliced format. Each layer represents a cross-section of the objects to be manufactured, and is sent to an additive manufacturing apparatus (also termed a "3D printer") where it is built upon a previously built layer. This process is repeated until the objects are completed, thereby building the objects layer-by-layer. While some available technologies directly print material, others use a recoating process to form successive layers that can then be selectively solidified in order to create each cross-section of the objects.

The build material from which the object or objects are manufactured may vary depending on the manufacturing technique and may comprise powder material, paste material, slurry material or liquid material. The build material may be provided in a source container from where it needs to be transferred to the building area or building compartment (e.g. chamber) of the additive manufacturing apparatus where the actual manufacturing takes place.

The object or objects to be manufactured may be specified in an object representation that describes the three-dimensional object.

BRIEF DESCRIPTION OF DRAWINGS

Examples will now be described, by way of non-limiting example, with reference to the accompanying drawings, in which.

DETAILED DESCRIPTION

Figure 1:
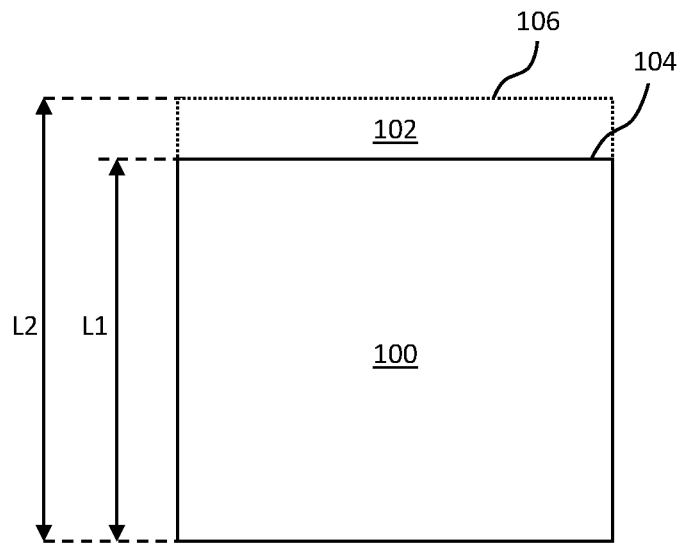
FIG. 1 is a simplified schematic of an example illustrating a post-processing operation.

Three-dimensional objects can be generated using additive manufacturing techniques. The objects may be generated by solidifying portions of successive layers of build material. In some examples, the build material can be powder-based and the properties of generated objects may be dependent on the type of build material and the type of solidification. In some examples the build material may be formed from, or may include, short fibres that may, for example, have been cut into short lengths from long strands or threads of material. The build material may in some examples include one or more plastics, ceramic, metal powders, and powder-like materials.

In some examples, solidification of the build material is enabled using a liquid solidification agent such as for example a fusing or binding agent. In further examples, solidification may be enabled by temporary application of energy to the build material. In certain examples, fusing and/or binding agents are applied to build material, wherein a fusing agent is a material that, when a suitable amount of energy is applied to a combination of build material and fusing agent, causes the build material to fuse and solidify. In some examples, a detailing agent may be applied to areas containing build material adjacent to an object being created, for example, so as to inhibit solidification of build material in these areas, or in some examples to provide a cooling effect to certain areas of build material. In other examples, other build materials and other methods of solidification may be used. In certain examples, the build material includes paste material, slurry material or liquid material.

In one example the build material in the source container is powder that has an average volume-based cross sectional particle diameter size of between approximately 5 and approximately 400 microns, between approximately 10 and approximately 200 microns, between approximately 15 and approximately 120 microns or between approximately 20 and approximately 80 microns. Other examples of suitable, average volume-based particle diameter ranges include approximately 5 to approximately 80, or approximately 5 to approximately 35 microns. In this disclosure a volume-based particle size is the size of a sphere that has the same volume as the powder particle. With "average" it is intended to explain that most of the volume-based particle sizes in the container are of the mentioned size or size range but that the container may also contain particles of diameters outside of the mentioned range. For example, the particle sizes may be chosen to facilitate distributing build material layers having thicknesses of between approximately 10 and approximately 500 microns, or between approximately 10 and approximately 200 microns, or between approximately 15 and approximately 150 microns. One example of an additive manufacturing system may be pre-set to distribute build material layers of approximately 90 microns using build material containers that contain powder having average volume-based particle diameters of between approximately 40 and approximately 60 microns. For example the additive manufacturing apparatus can be reset to distribute different layer thicknesses.

Suitable powder-based build materials for the container of this disclosure include at least one of polymers, crystalline plastics, semi-crystalline plastics, polyethylene (PE), polylactic acid (PLA), acrylonitrile butadiene styrene (ABS), amorphous plastics, Polyvinyl Alcohol Plastic (PVA), Polyamide, thermo(setting) plastics, resins, transparent powders, colored powders, metal powder, ceramics powder such as for example glass particles, and/or a combination of at least two of these or other materials wherein such combination may include different particles each of different materials or different materials in a single compound particle. Examples of blended build materials include alumide, which may include a blend of aluminum and polyamide, multi-color powder, and plastics/ceramics blends.

In some examples of additive manufacturing, it may be the case that build materials become heated. For example, where fusing agents are applied and caused to absorb energy, this tends to heat the build material, in particular in the regions to which fusing agents have been applied. This may result in solidification of portions of build material where the fusing agent has been applied. In addition, some additive manufacturing processes may pre-heat build materials, or may comprise exothermic chemical reactions or the like.

In some examples of additive manufacturing, binding agents may be applied to portions of a layer of build material. This may cause the portions of build material to solidify due to a binding process, and may in some examples occur without heat being applied to the layer of build material. Alternatively, use of a binding agent may also include application of heat to dry and/or cure the binding agent without causing the build material to melt.

An additive manufacturing apparatus such as a 3D printer may create one or more objects within a build chamber during a 3D printing task. That is, for example, as layers of build material are built up in a build chamber of the apparatus, agents may be applied to the layers so as to create one object or multiple objects in the build chamber. At the end of the manufacturing operation, the objects (also referred to as parts, articles or items) may be removed from the compartment, and unfused build material may also be removed.

An object that has been produced in an additive manufacturing process may undergo a post-processing operation, that is, after the additive manufacturing process. For example, the object may be processed to change the properties one or more surfaces of the object, or to all surfaces or exposed surfaces. In some examples, the object may be processed to apply a coating, dye, plating, or other material. In some examples, the surface roughness or texture may be changed. In some examples, a surface of the object may be processed to become smoother, e.g. in a tumbling operation.

In some cases, the post-processing operation may change the shape and/or dimensions of an object. For example, a metal plating applied to the object in a post-processing operation may have a thickness of 250 microns. Therefore, as a result of a post-processing operation, the size and/or shape of the object may be outside of tolerances required for the object and hence the object may be unsuitable for its intended purpose (e.g. to be combined with or joined to another object).

FIG. 1 is a simplified schematic of an example illustrating a post-processing operation that applies a coating to an object 100. The coating 102 is applied to a surface 104 of the object. As a result, the surface 104 of the object is no longer an external surface following application of the coating 102. Instead, the object 100 has a new external surface 106 which is the surface of the coating 102. The surface 106 of the coating 106 overlies the surface 104 of the object 100. Therefore, the coating 102 has changed the size, shape and/or dimensions of the object 100.

In the example shown in FIG. 1, the object 100, before the coating 102 is applied, has a dimension (e.g. length or width) of L1. After the coating 102 is applied, this length has increased to L2, due to the thickness of the coating (L2−L1).

Figure 2:
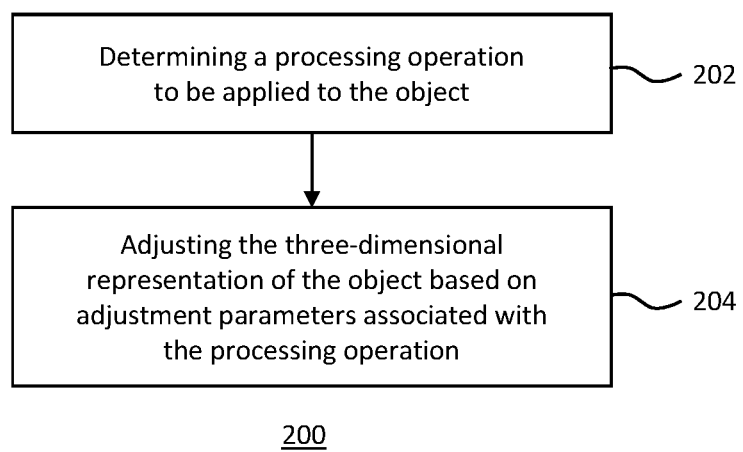
FIG. 2 is a flow chart of an example of a method of adjusting a three-dimensional representation of an object.

The object 100 may be represented by a three-dimensional representation, such as for example a 3D Manufacturing Format (3MF) file, any three-dimensional object description format, or a format or list of instructions intended to be provided to an additive manufacturing apparatus for creation of the object. FIG. 2 is a flow chart of an example of a method 200 of adjusting a three-dimensional representation of an object to be manufactured in an additive manufacturing process. The method comprises, at block 202, determining a processing operation to be applied to the object. The processing operation may be, for example, an operation to change the properties of one or more surfaces of the object, or to all surfaces or exposed surfaces. In some examples, the object may be processed to apply a coating, dye, plating, or other material. In some examples, the surface roughness or texture may be changed. In some examples, a surface of the object may be processed to become smoother, e.g. in a tumbling operation. In some examples, the processing operation may enlarge the object (e.g. if a layer is applied to an external surface of the object) or reduce the size or volume of the object (e.g. during a tumbling operation).

The method 200 comprises, in block 204, adjusting the three-dimensional representation of the object based on adjustment parameters associated with the processing operation. The adjustment parameters may in some examples be parameters that indicate the type of processing operation and/or the manner in which the processing operation changes the size, shape and/or dimension of the object. Additionally or alternatively, the parameters may specify the manner in which the three-dimensional representation should be adjusted, e.g. may specify one or more mathematical operations to be applied to the three-dimensional representation, or may specify the manner in which changes to the object during the processing operation can be counteracted by the adjustment to the three-dimensional representation.

The processing operation may be, for example an operation that changes a dimension, size and/or shape of the object following an additive manufacturing process that creates the object.

Figure 3:
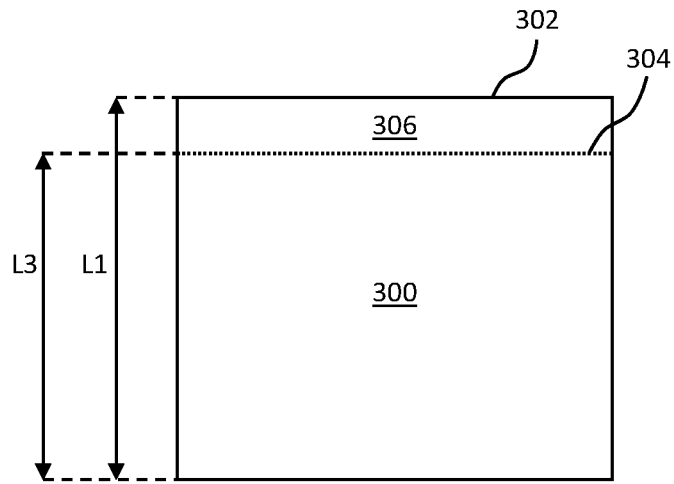
FIG. 3 is a simplified schematic of an example illustrating a post-processing operation.

In some examples, the adjustment parameters may provide information such that a transformation may be applied to the three-dimensional representation of the object. The transformation may counteract at least some of the change in size, shape and/or dimension of the created object due to the post-processing operation. FIG. 3 is a simplified schematic of an example illustrating a post-processing operation that applies a coating to an object 300. The object 300 may be identical to that shown in FIG. 1, and have a dimension L1. A processing operation may be intended for the created object 100, which may be applied to a surface 302. However, this coating may have a thickness, which would change the dimension of the object. Therefore, a transformation may be applied to the three-dimensional representation of the object, which has the effect of moving the surface 302 of the object to a position 304, and thus for example reducing the dimension of the object to L3. As a result, following creation of the object 100 in an additive manufacturing process that creates the object 100 from the transformed three-dimensional representation, the coating 306 may be applied to the surface 304 of the object. This may in turn move the external surface of the object substantially to the position of the surface 302. As a result, the object following the processing operation may be similar or identical in size, shape and/or dimensions to the object described in the three-dimensional representation before the transformation was applied.

In another example, referring to FIG. 3, an intended surface of an object may be the surface 304, and the intended dimension L3. However, a processing operation applied to the object may reduce the dimension L3. For example, a tumbling, buffing or blasting operation may be applied to the object. Therefore, an adjustment to the three-dimensional operation may move the surface 304 to the position at 302, such that when the object 300 is created and the processing operation is carried out, the surface 302 of the object moves to or approximately to position 304.

In some examples, the adjustment parameters may specify a transformation to be applied to the three-dimensional representation, the transformation being dependent on the particular processing operation that is to be applied to the object. In some examples, the adjustment parameters may specify the changes to the object (or any object) that are expected as a result of the processing operation, and may thus allow a transformation for the three-dimensional representation to be determined. The adjustment parameters may in some examples identify a particular processing operation, and details on how the processing operation may affect an object, or details on suitable surface properties for the object to undergo the processing operation, may be obtained based on the identified processing operation. For example, the details may be obtained from a database storing such details. From these details, suitable adjustments to the three-dimensional representation can be determined.

In some examples, the three-dimensional representation may be adjusted to offset a surface in a certain direction in view of the processing operation that is to be applied to the object. For example, referring to FIG. 3, the surface 302 may be moved to the position shown at 304 by offsetting the surface 302, for example towards a centre of mass, coordinate centre, selected point, selected direction or other point or direction. The size or shape of the surface 302 may also change in some examples, for example if the surface 302 is adjacent to other surfaces and its movement to position 304 would cause the surface to change size or shape in order to fit adjacent to the other surfaces. Other surfaces may also change size and/or shape as a result of movement of the surface from position 302 to 304.

Figure 4:
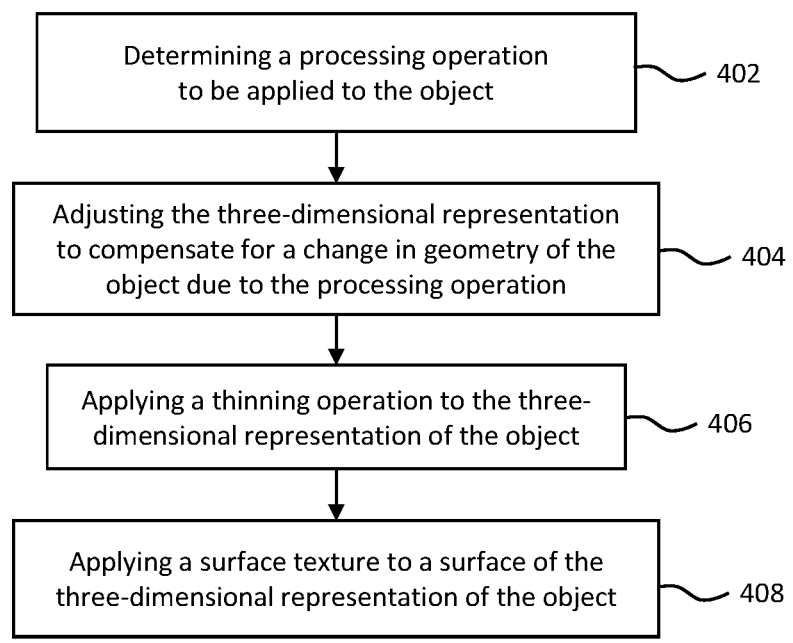
FIG. 4 is a flow chart of an example of a method of adjusting a three-dimensional representation of an object.

FIG. 4 is a flow chart of an example of a method 400 of adjusting a three-dimensional representation of an object to be manufactured in an additive manufacturing process. The method comprises, at block 402, determining a processing operation to be applied to the object and, at block 404, adjusting the three-dimensional representation to compensate for a change in geometry of the object due to the processing operation to be applied to the object. Block 404 may in some examples be an implementation of block 204 in FIG. 2 of adjusting the three-dimensional representation of the object based on adjustment parameters for a processing operation to be applied to the object. Therefore, for example, any change in the geometry of the object (e.g. the size and/or shape of the object, and/or any change in the dimensions of the object) can be pre-compensated such that if the object undergoes the processing operation following creation of the object, for example in an additive manufacturing process, the object following the processing operation may have similar or identical geometry to the object as described in the representation before it was adjusted.

Block 406 of the method 400 comprises applying a thinning operation to the three-dimensional representation of the object. This may in some examples be an implementation of block 204 in FIG. 2 of adjusting the three-dimensional representation of the object based on adjustment parameters for a processing operation to be applied to the object. Therefore, for example, the three-dimensional representation of the object can be adjusted to compensate for an expected change in the object during a processing operation, where the processing operation applies a coating to the object. The coating may be, for example, a dye, paint, electroplating, water resistant layer, or any other coating and/or multiple coatings.

Block 408 of the method 400 comprises applying a surface texture to a surface of the three-dimensional representation of the object. This may in some examples be an implementation of block 204 in FIG. 2 of adjusting the three-dimensional representation of the object based on adjustment parameters for a processing operation to be applied to the object. Therefore, for example, a surface of the object can be prepared such that it may be more suitable for the processing operation. For example, a surface texture may include a rough texture that allows a greater adhesion of a coating applied during the processing operation to the surface of the object when compared to adhesion of the coating to the surface without the texture.

In some examples, other structural changes may be made to the three-dimensional representation of the object in view of the processing operation to be applied to the object. For example, holes may be introduced for insertion of electrodes for an electroplating process. In another example, small holes or an increased porosity may be applied to a surface in preparation for a processing operation that applies a dye to the surface, so that the dye may penetrate the surface.

Figure 5:
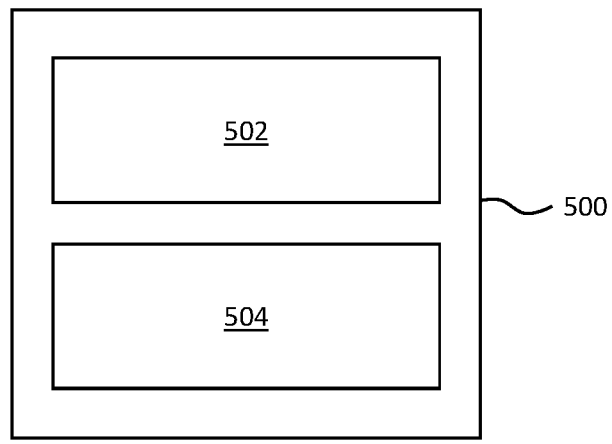
FIG. 5 is a simplified schematic of an example of apparatus for processing a 3D model.

FIG. 5 is a simplified schematic of an example of apparatus 500 for processing a 3D model. The apparatus 500 comprises a processing module 502 to process the 3D model to produce an amended 3D model, wherein the process is based on a treatment to be performed on an object. The 3D model may for example describe the object, and may for example be a 3MF file or any other suitable 3D object description format. The treatment to be performed on the object may be intended to be performed following, for example, production of the object in an additive manufacturing or 3D printing process. The treatment may change a property of the object, such as for example the shape, size and/or geometry of the object, and/or a dimension of the object. The treatment may change the appearance, colour, texture or any other property of the object.

The apparatus 500 also includes a sending module 504 to send the amended 3D model to an additive manufacturing apparatus to create the object from the amended 3D model. The apparatus 500 may be, for example, a computing apparatus used by a user to prepare and submit additive manufacturing tasks to an additive manufacturing apparatus. Alternatively, the apparatus 500 may be, for example, part of an additive manufacturing or 3D printing device that accepts data (e.g. 3D models) describing objects and processes the data in view of intended treatments to one or more of the objects.

In some examples, the treatment to be performed on the object modifies a dimension of the first object, and wherein the processing module 502 is to process the 3D model to produce the amended 3D model by modifying a dimension of the 3D model to counteract the modification of the dimension. Therefore, the object produced from the amended 3D model and that subsequently undergoes the treatment may have a dimension that is similar or equal to the dimension of the object in the unamended 3D model. For example, where the dimension is modified by a layer of material to a surface of the object during the treatment, the modified dimension following treatment may be equal or substantially equal to the dimension of the unamended 3D model.

In some examples, the processing module 502 is to process the 3D model by eroding a surface of the 3D model based on the treatment to be performed on the object. Such a process may have the opposite effect of applying a layer of material to an external surface of the object, such that once the layer is applied during the treatment, the final object has a shape, size, geometry and/or dimension similar or identical to that in the originally described object in the unamended 3D model.

In some examples, the processing module 502 is to process the 3D model by applying a structural modification to the 3D model based on the treatment to be performed on the object. This may be to counteract a geometry or size change as suggested above, but may also be for other purposes. For example, an increase of surface porosity or roughness may be applied to a surface in view of the treatment to be applied to the surface or the object, or holes for drainage or insertion of electrodes may be added to the 3D model, to produce the amended 3D model.

In some examples, the processing module 502 is to receive the 3D model, and receive an indication of a process to be applied to the 3D model to produce the amended 3D model. The indication of the process to be applied may be, for example, an indication of a transformation to be applied to the 3D model, or may indicate properties of the treatment to be applied, from which a transformation for the 3D model may be derived.

Figure 6:
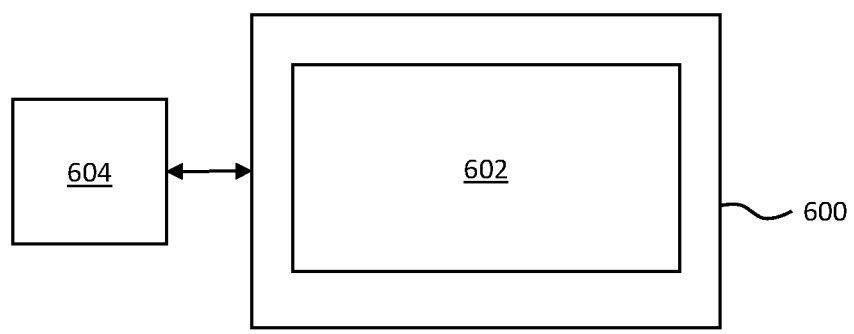
FIG. 6 is a simplified schematic of an example of a machine-readable medium.

FIG. 6 is a simplified schematic of an example of a machine-readable medium 600 comprising instructions 602. When executed by a processor 604, the instructions 602 cause the processor 604 to process a first object description based on a surface modification parameter to produce a second object description, wherein the second object description describes an object and wherein the surface modification parameter is based on a surface modification to be performed on the object following an additive manufacturing procedure to create the object.

In some examples, therefore, the object produced (e.g. by an additive manufacturing process) from the second object description, and then modified by the surface modification, may have a property similar or identical to that which the object would have if the object were produced from the first object description. The property may be, for example, a geometry, size, shape, dimension and/or other property. Additionally or alternatively, process on the first object description may modify a surface of the object in the second object description surface in preparation for the surface modification. For example, the process may add surface texture, porosity, holes and/or other properties.

In some examples, the instructions 602 include instructions that, when executed by the processor 604, cause the processor 604 to process the first object description to produce the second object description by altering the first object description to counterbalance an estimated change to a shape of the object due to the surface modification to be performed on the object. In an example, where the surface modification is a coating such as paint, electroplating, water resistant coating or other coating applied to a surface, the object in the first object description may be altered in a manner opposite to that done by the surface modification, such that the object produced from the second object description and then modified may have the same or similar shape to the object in the first object description.

In some examples, the instructions 602 include instructions that, when executed by the processor 604, cause the processor 604 to provide the second object description to an additive manufacturing device to create the object. The object, produced from the second object description, may then undergo the surface modification.

In some examples, the instructions 602 include instructions that, when executed by the processor 604, cause the processor 604 to receive a notification of the surface modification to be performed on the object. The processor may use this information accordingly to produce the second object description. The notification may in some examples identify a transformation or other procedure to be applied to the first object description to produce the second object description. In some examples, the notification may identify the surface modification, or may identify properties of the surface modification, thus allowing calculation of the effects of the surface modification to an object. From this, the processor 602 may calculate a transformation for the first object description to produce the second object description.

In some examples, the instructions 602 include instructions that, when executed by the processor 604, cause the processor 604 to modify a surface property of the first object description based on the surface modification parameter, thus creating the second object description. The surface property may be, for example, a dimension, size, shame and/or geometry. The surface property may additionally or alternatively be the porosity, texture and/or other structural feature of a surface being modified.

In some examples, any change or modification to a surface of an object specified in a representation, description or model may be made to one of a plurality of surfaces of the object, a part of a surface of an object, or to all surfaces, external surfaces or visible surfaces of an object. Where a representation, description or model specifies multiple objects, modifications may be made to one or more surfaces or partial surfaces of one, more than one or all of the objects.

Some examples modify an object specified in a representation, description or model in such a manner that the object produced in accordance with the representation, description or model which then undergoes a post-processing operation (e.g. following creation in an additive manufacturing process) remains within tolerances required of the object. For example, the object may be within tolerances for the object specified in the original, non-modified representation, description or model.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each flow and/or block in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams. In particular, a processor or processing apparatus may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method of adjusting a first three-dimensional representation to produce a second three-dimensional representation of an object to be manufactured in an additive manufacturing process, the method comprising:
   identifying a type of a post-processing operation based on adjustment parameters, wherein the post-processing operation is to be applied to the object after creation of the object in the additive manufacturing process;
   determining a transformation for the first three-dimensional representation of the object based on details of the post-processing operation; and
   adjusting the first three-dimensional representation of the object based on the transformation to produce the second three-dimensional representation that provides greater adhesion between a coating to be applied by the post-processing operation and a surface of the object than the first three-dimensional representation.

2. The method of claim 1, wherein adjusting the first three-dimensional representation of the object comprises adjusting the first three-dimensional representation of the object to compensate for a change in geometry of the object due to the post-processing operation to be applied to the object.

3. The method of claim 1, wherein adjusting the first three-dimensional representation of the object comprises applying a thinning operation to the first three-dimensional representation of the object.

4. The method of claim 1, wherein adjusting the first three-dimensional representation of the object comprises applying a surface texture to a surface of the first three-dimensional representation of the object.

5. The method of claim 1, wherein the post-processing operation to be applied to the object comprises an operation to apply plating, paint or dye to the object.

6. The method of claim 1, wherein adjusting the first three-dimensional representation of the object comprises adjusting the first three-dimensional representation of the object to promote compatibility between the object and the post-processing operation.

7. Apparatus for processing a first 3D model, the apparatus comprising:
   a processor; and
   memory coupled to the processor, the memory storing instructions that upon execution by the processor cause the processor to:
      identify an intended treatment to be performed on an object after creation of the object in an additive manufacturing process;
      process the first 3D model based on the intended treatment to produce an amended 3D model that provides greater adhesion between a coating to be applied by the intended treatment and a surface of the object than the first 3D model; and
      send the amended 3D model to an additive manufacturing apparatus to create the object from the amended 3D model.

8. The apparatus of claim 7, wherein the intended treatment to be performed on the object modifies a dimension of the object, and wherein the processor is to process the first 3D model by modifying a dimension of the first 3D model to counteract modification of the dimension of the object.

9. The apparatus of claim 7, wherein the processor is to process the first 3D model by eroding a surface of the first 3D model based on the intended treatment to be performed on the object.

10. The apparatus of claim 7, wherein the processor is to process the first 3D model by applying a structural modification to the first 3D model based on the intended treatment to be performed on the object.

11. The apparatus of claim 7, further comprising receiving the first 3D model, and receiving an indication of the intended treatment to be applied to the object.

12. The apparatus of claim 7, wherein the amended 3D model provides greater compatibility between the object and the intended treatment than the first 3D model.

13. A non-transitory machine-readable medium comprising instructions that, when executed by a processor, cause the processor to:
   process a first object description based on a surface modification parameter to produce a second object description, wherein the second object description describes an object, the surface modification parameter is based on a surface modification to be performed on the object by a post-processing operation following an additive manufacturing procedure to create the object, the post-processing operation applies a coating to the object, and the second object description provides higher adhesion between the object and the coating than the first object description.

14. The non-transitory machine-readable medium of claim 13, further comprising instructions that, when executed by the processor, cause the processor to process the first object description to produce the second object description by altering the first object description to counterbalance an estimated change to a shape of the object due to the surface modification to be performed on the object.

15. The non-transitory machine-readable medium of claim 13, comprising instructions that, when executed by the processor, cause the processor to provide the second object description to an additive manufacturing device to create the object.

16. The non-transitory machine-readable medium of claim 13, comprising instructions that, when executed by the processor, cause the processor to receive a notification of the surface modification to be performed on the object.

17. The non-transitory machine-readable medium of claim 13, comprising instructions that, when executed by the processor, cause the processor to modify a surface property of the first object description based on the surface modification parameter.

\* \* \* \* \*